US012631683B2

(12) United States Patent
Eschhofen et al.

(10) Patent No.: US 12,631,683 B2
(45) Date of Patent: May 19, 2026

(54) SYSTEM AND METHOD FOR DETECTING A BREAKER TRIP

(71) Applicant: Vertiv Corporation, Westerville, OH (US)

(72) Inventors: Kevin K. Eschhofen, Galena, OH (US); Kevin R. Ferguson, Dublin, OH (US)

(73) Assignee: Vertiv Corporation, Westerville, OH (US)

( * ) Notice: Subject to any disclaimer, the term of this patent is extended or adjusted under 35 U.S.C. 154(b) by 153 days.

(21) Appl. No.: 18/231,096

(22) Filed: Aug. 7, 2023

(65) Prior Publication Data

US 2024/0061043 A1     Feb. 22, 2024

Related U.S. Application Data

(60) Provisional application No. 63/399,959, filed on Aug. 22, 2022.

(51) Int. Cl.
*G01R 31/327*      (2006.01)
*G01R 19/165*      (2006.01)
*H02H 3/24*          (2006.01)

(52) U.S. Cl.
CPC ...  *G01R 31/3275* (2013.01); *G01R 19/16533* (2013.01); *H02H 3/24* (2013.01)

(58) Field of Classification Search
None
See application file for complete search history.

(56) References Cited

U.S. PATENT DOCUMENTS

| | | | |
|---|---|---|---|
| 2005/0273207 A1* | 12/2005 | Dougherty | H02J 3/0012 |
| | | | 361/64 |
| 2009/0122453 A1* | 5/2009 | Vicente | H01H 71/7409 |
| | | | 361/93.3 |
| 2011/0204727 A1* | 8/2011 | Koshizuka | H01H 9/563 |
| | | | 307/140 |
| 2013/0120090 A1 | 5/2013 | Ball | |
| 2014/0071575 A1* | 3/2014 | Parker | H01H 71/04 |
| | | | 361/115 |
| 2016/0036214 A1* | 2/2016 | Meiri | H02H 7/263 |
| | | | 361/87 |
| 2018/0316186 A1 | 11/2018 | Klocman et al. | |
| 2020/0379045 A1* | 12/2020 | Capot | H01H 71/04 |

OTHER PUBLICATIONS

European Search Report dated Mar. 1, 2024; European Application No. 23191584.4.

* cited by examiner

*Primary Examiner* — Nasima Monsur
(74) *Attorney, Agent, or Firm* — Suiter Swantz IP

(57) ABSTRACT

A power distribution system may include an input power source and at least one circuit breaker associated with each branch circuit receiving power from the input power source. The power distribution system may also include a monitoring subsystem configured to detect when a line side voltage of the at least one circuit breaker is above an undervoltage fault value and when the current through the at least one circuit breaker is above a minimum value for at least one line cycle, and notifying of a breaker trip condition when the current through the at least one circuit breaker falls below the minimum value and then below a zero current level or a circuit breaker magnetizing current level within a threshold number of line cycles and the line side voltage of the at least one circuit breaker remains above the undervoltage fault value.

18 Claims, 7 Drawing Sheets

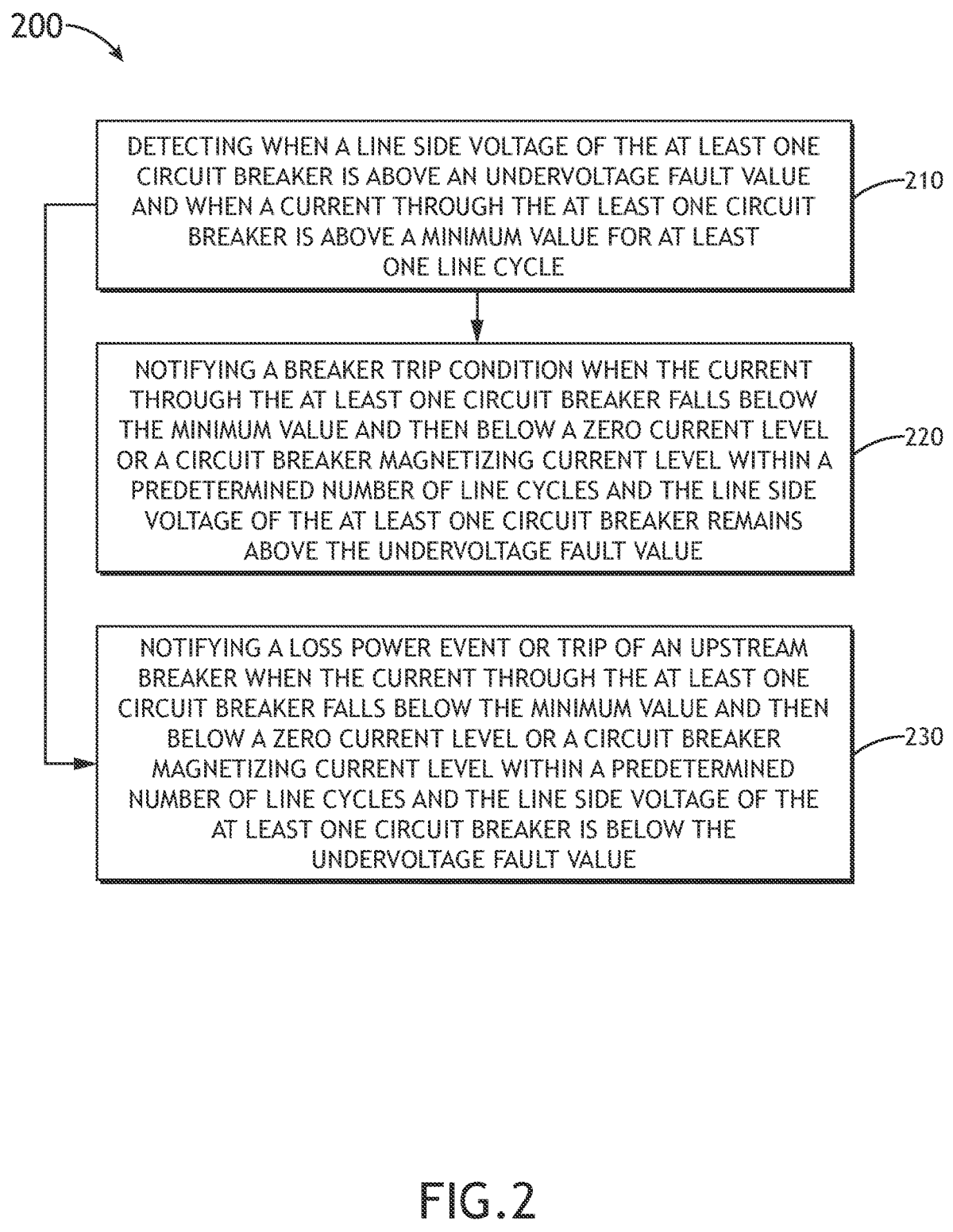

200

DETECTING WHEN A LINE SIDE VOLTAGE OF THE AT LEAST ONE CIRCUIT BREAKER IS ABOVE AN UNDERVOLTAGE FAULT VALUE AND WHEN A CURRENT THROUGH THE AT LEAST ONE CIRCUIT BREAKER IS ABOVE A MINIMUM VALUE FOR AT LEAST ONE LINE CYCLE ⟶ 210

NOTIFYING A BREAKER TRIP CONDITION WHEN THE CURRENT THROUGH THE AT LEAST ONE CIRCUIT BREAKER FALLS BELOW THE MINIMUM VALUE AND THEN BELOW A ZERO CURRENT LEVEL OR A CIRCUIT BREAKER MAGNETIZING CURRENT LEVEL WITHIN A PREDETERMINED NUMBER OF LINE CYCLES AND THE LINE SIDE VOLTAGE OF THE AT LEAST ONE CIRCUIT BREAKER REMAINS ABOVE THE UNDERVOLTAGE FAULT VALUE ⟶ 220

NOTIFYING A LOSS POWER EVENT OR TRIP OF AN UPSTREAM BREAKER WHEN THE CURRENT THROUGH THE AT LEAST ONE CIRCUIT BREAKER FALLS BELOW THE MINIMUM VALUE AND THEN BELOW A ZERO CURRENT LEVEL OR A CIRCUIT BREAKER MAGNETIZING CURRENT LEVEL WITHIN A PREDETERMINED NUMBER OF LINE CYCLES AND THE LINE SIDE VOLTAGE OF THE AT LEAST ONE CIRCUIT BREAKER IS BELOW THE UNDERVOLTAGE FAULT VALUE ⟶ 230

FIG.2

SYSTEM AND METHOD FOR DETECTING A BREAKER TRIP

CROSS-REFERENCE TO RELATED APPLICATIONS

The present application claims the benefit under 35 U.S.C. § 119(e) of U.S. Provisional Application Ser. No. 63/399,959, filed Aug. 22, 2022, which is incorporated herein by reference in the entirety.

FIELD

The present disclosure generally relates to power distribution systems, and more particularly to a power distribution system and method for detecting a breaker trip.

BACKGROUND

It is well known to employ circuit protection devices in electrical power distribution systems. Circuit protection devices may protect against faults and overloads that may occur in an electrical power distribution system. For example, an electrical power distribution system may include a circuit protection device, such as a circuit breaker. A circuit breaker may refer to an electrical device which creates an open circuit upon detection of a fault or an overload condition.

When a circuit breaker detects a fault or overload condition, and creates an open circuit (also referred as a breaker trip), it is often desirable for an administrator (such as monitoring equipment or personnel) to be aware of the fault or overload condition. When an administrator is notified of the breaker trip, the administrator may be able to address downstream fault conditions as soon as possible. This is particularly important in certain electrical power distribution systems, such as an electrical power distribution system for a data center.

Conventional circuit breakers may include an auxiliary switch (Aux and Bell) which may provide a notification or signal to an administrator upon a breaker trip. For example, in the event of a fault or overload condition, a circuit breaker trip may occur and an alarm or backup power source may be activated by the circuit breaker auxiliary switch. A circuit breaker auxiliary switch may be a circuit breaker accessory, and may include hardware elements which are connected within or to a circuit breaker to provide a notification or signal upon a breaker trip. In some applications, circuit breakers may be small, and located within an area of an electrical device, such as a panel board, where it may not be feasible or practical to use a circuit breaker auxiliary switch. Furthermore, the added costs for the hardware elements of the circuit breaker auxiliary switch, the ability to properly wire the circuit breaker auxiliary switch for signaling purposes, and the possible reliability issues associated with the additional connections required for a circuit breaker auxiliary switch limit the usefulness and effectiveness of circuit breaker auxiliary switches.

SUMMARY

Accordingly, the present disclosure is directed to a power distribution system and method for detecting a breaker trip. The power distribution system may include an input source of power, at least one circuit breaker associated with each branch circuit receiving power from the input source of power. The power distribution system may include a monitoring subsystem which may include a processor operatively coupled to the at least one circuit breaker and a memory with instructions stored upon, that when executed by the processor, cause the processor to detect when a line side voltage of the at least one circuit breaker is above an undervoltage fault value and when the current through the at least one circuit breaker is above a minimum value for at least one line cycle, and notifying of a breaker trip condition when the current through the at least one circuit breaker falls below the minimum value and then below a zero current level or a circuit breaker magnetizing current level within a threshold number of line cycles and the line side voltage of the at least one circuit breaker remains above the undervoltage fault value.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures.

FIG. 2 is a flow diagram of a method executed by a monitoring subsystem of a power distribution system in accordance with one or more embodiments of the present disclosure.

DETAILED DESCRIPTION

Figure 1:
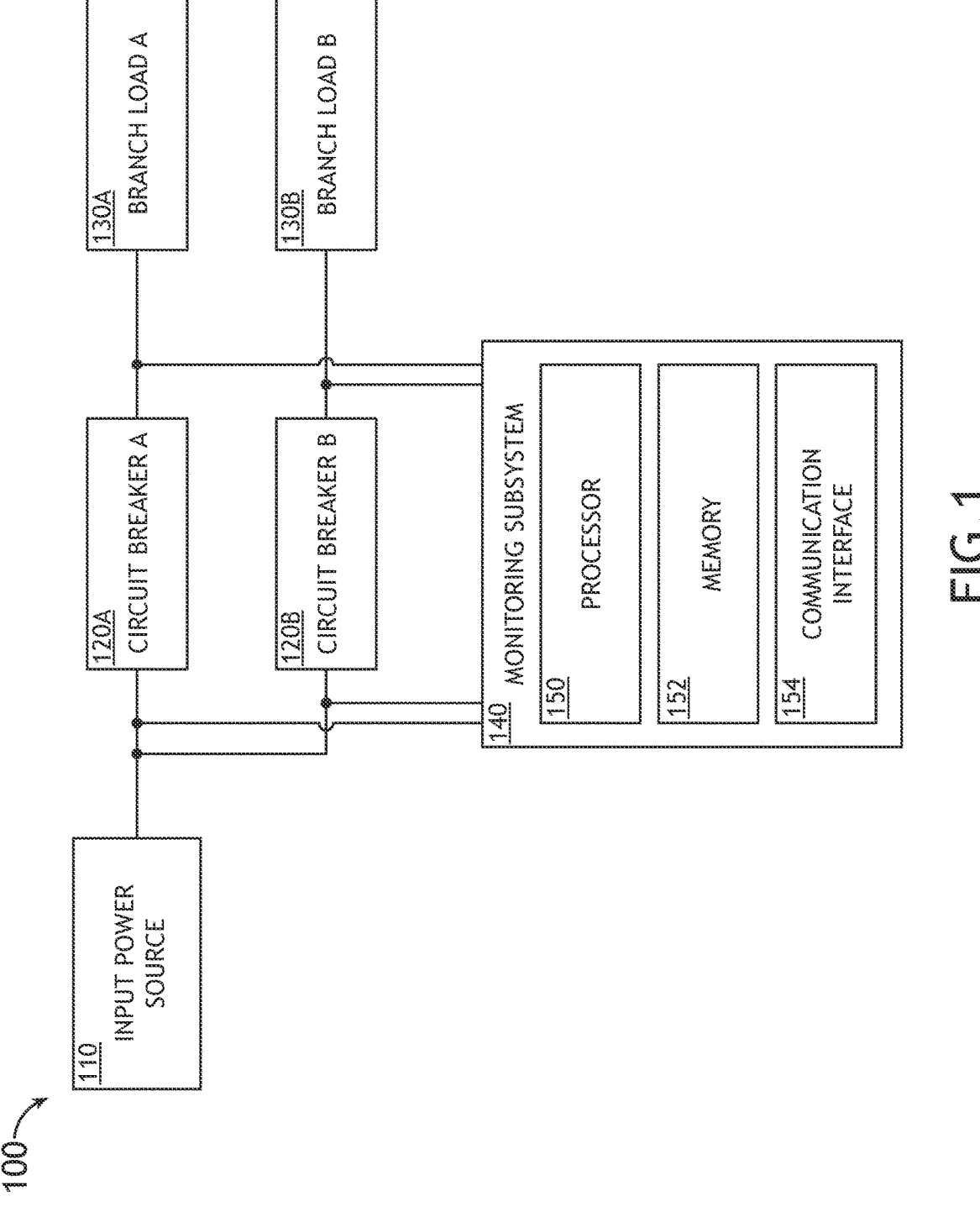
FIG. 1 is a block diagram of a power distribution system in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "embodiments" means that a particular element, feature, structure, or characteristic described in connection with the embodiment is included in at least one embodiment disclosed herein. The appearances of the phrase "in embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, a block diagram of a power distribution system 100 in accordance with one or more embodiments of the present disclosure is shown. Power distribution system 100 may include an input power source 110, at least one circuit breaker 120A, 120B associated with each branch circuit or load 130A, 1308 receiving power from the input power source 110. The power distribution system 100 may further include a monitoring subsystem 140 which may include a processor 150 operatively coupled to the at least one circuit breaker 120A, 120B, and a memory 152 with instructions stored upon, that when executed by the processor 150, cause the processor execute a method of the present disclosure to monitor a status of the circuit breaker 120A, 120B. The monitoring subsystem 140 may further include a communication interface 154 which may be operatively configured to communicate with other components of the power distribution system 100, including a line side voltage measurement or current measurement through the at least one circuit breaker 120A, 120B.

Referring to FIG. 2, a flow diagram of a method 200 executed by a monitoring subsystem of a power distribution system in accordance with one or more embodiments of the present disclosure is shown. It is contemplated that steps of the flow diagram 200 may be executed by the processor 150 of the monitoring subsystem 140 of the power distribution system 100 as shown in FIG. 1.

Method 200 may begin by detecting when a line side voltage of the at least one circuit breaker is above an undervoltage fault value and when a current through the at least one circuit breaker is above a minimum value for at least one line cycle 210. Next, method 200 may include notifying of a breaker trip condition when the current through the at least one circuit breaker falls below the minimum value and then below a zero current level or a circuit breaker magnetizing current level within a threshold number of line cycles and the line side voltage of the at least one circuit breaker remains above the undervoltage fault value 220. It is contemplated that the indication of a breaker trip may further indicate a load loss event when the at least one circuit breaker is employed in a power distribution system and is connected to a load.

Alternatively, method 200 may further include notifying of a loss power event or trip of an upstream breaker when the current through the at least one circuit breaker falls below the minimum value and then below a zero current level or a circuit breaker magnetizing current level within a threshold number of line cycles and the line side voltage of the at least one circuit breaker is below the undervoltage fault value 230. It is contemplated that notifying of a breaker trip condition in step 220 or notifying of a loss power event or trip of an upstream breaker may be dependent upon a value of the line side voltage of the at least one circuit breaker that is being monitored according to one embodiment of the present disclosure.

Figure 3:
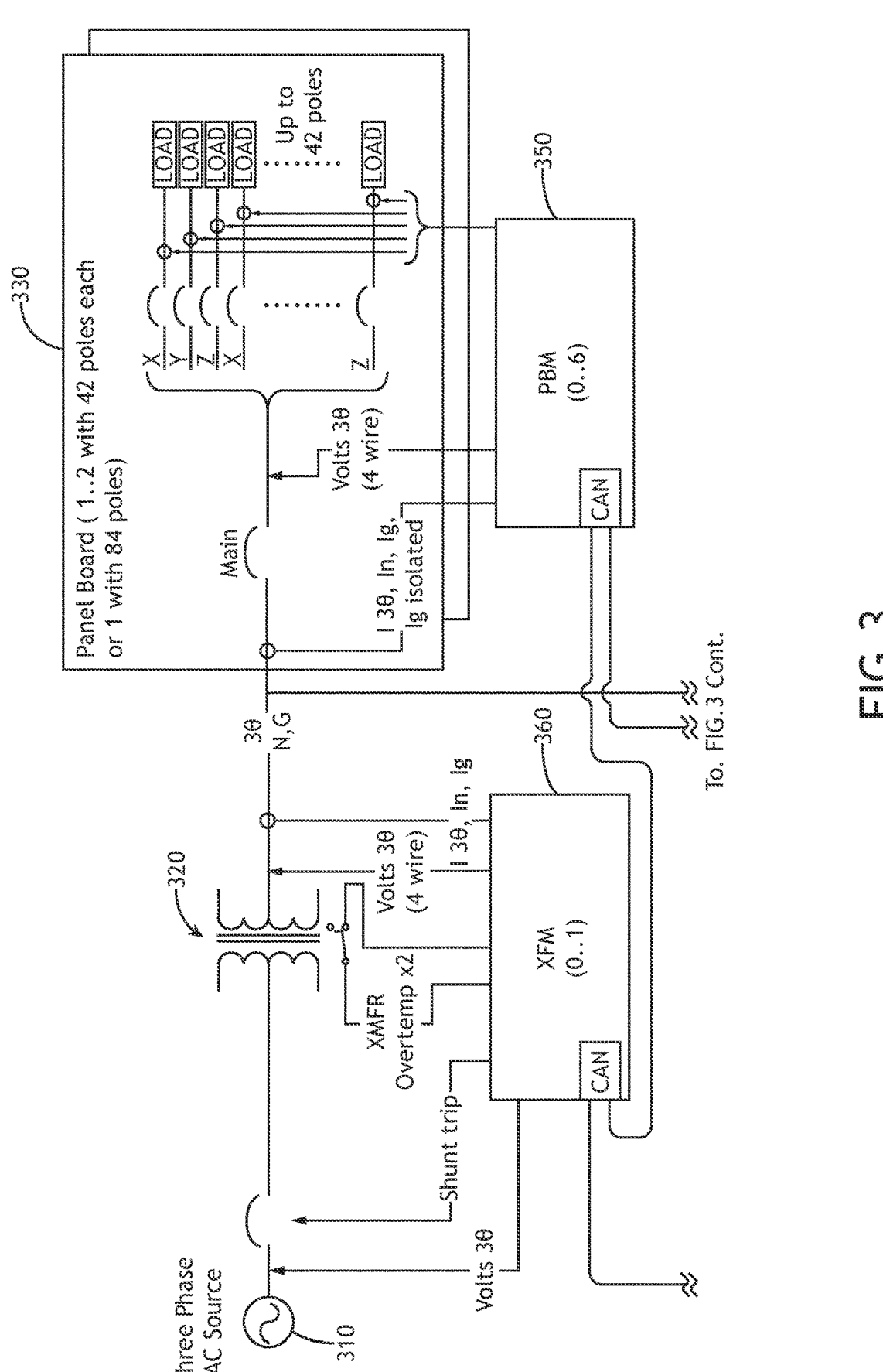
FIG. 3 is a circuit diagram of a power distribution system in accordance with one or more embodiments of the present disclosure.
Figure 3:
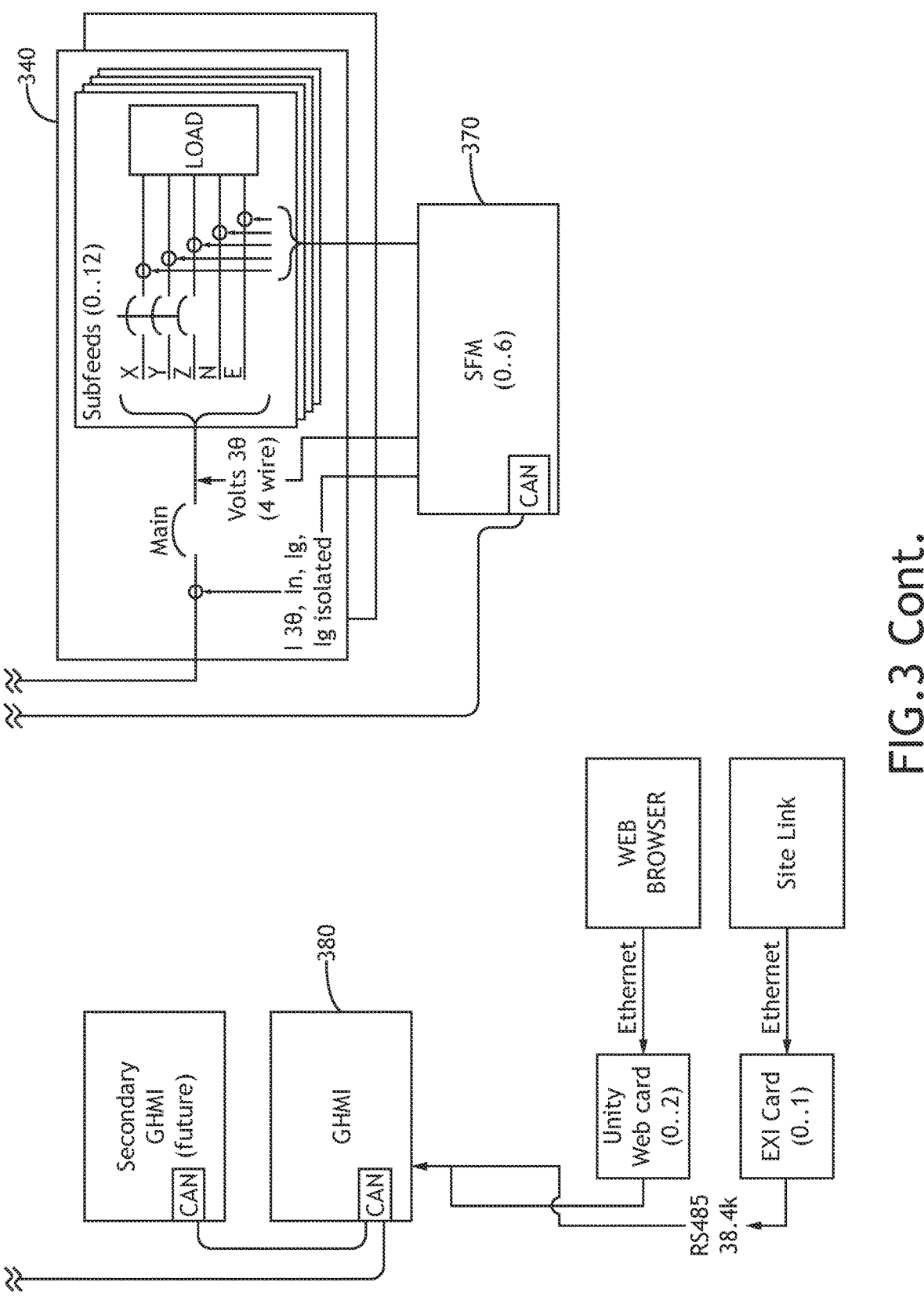

Referring to FIG. 3, a circuit diagram of a power distribution system 300 in accordance with one or more embodiments of the present disclosure is shown. A three phase AC source 310 may be one example of the input power source 110 as shown in FIG. 1. The input power source may be a one phase AC source or two phase AC source in alternative embodiments. The input power source in the form of a three phase AC source 310 may be fed to a transformer 320, the output of the transformer 320 representing mains power which may be fed to a panel board 330 and subfeeds 340. The panel board 330 may include several branch circuits or loads with each branch circuit or load including at least one circuit breaker associated with each branch circuit. In this embodiment, the power distribution system 300 may be configured to detect a breaker trip of the at least one circuit breaker associated with each branch circuit. However, it is contemplated that the power distribution system 300 and method may detect a breaker trip with any type of circuit breaker.

The power distribution system 300 may include a monitoring subsystem 140 as shown in FIG. 1 which may be coupled to the at least one circuit breaker. In an embodiment, the monitoring system may include a processor 150, a memory 152, and a communication interface 154. It is contemplated that the monitoring subsystem 140 may be embedded within one or more devices, which may be in proximity to the at least one circuit breaker or may be located remotely to the at least one circuit breaker. For example, referring once again to FIG. 3, the monitoring subsystem may be embedded in a panel board monitor ("PBM") 350, a transformer monitor ("XFM") 360, a subfeed monitor ("SFM") 370, and/or a human machine interface ("GHMI") 380 as shown in FIG. 3. It is contemplated that GHMI 380 may include a computing appliance or server appliance.

Referring again to FIG. 1, the processor 150 of the monitoring subsystem 140 may include any processor or processing element known in the art. For the purposes of the present disclosure, the term "processor" or "processing element" may be broadly defined to encompass any device having one or more processing or logic elements (e.g., one or more microcontrollers, one or more micro-processor devices, one or more application specific integrated circuit (ASIC) devices, one or more field programmable gate arrays (FPGAs), or one or more digital signal processors (DSPs)). In this sense, the processor 150 may include any device configured to execute algorithms and/or instructions (e.g., program instructions stored in the memory 152 of the monitoring subsystem 140). In one embodiment, the processor 150 may be embodied in a form of a desktop computer, mainframe computer system, workstation, image computer, parallel processor, networked computer, or any other computer system configured to execute a program configured to operate the breaker detection program as described throughout the present disclosure.

The memory 154 of the monitoring subsystem 140 may include a tangible, computer-readable storage medium that provides storage functionality to store various data and/or program code associated with operation of the processor 150, such as software programs and/or code segments, or other data to instruct the processor 150 to perform the functionality described herein. Thus, the memory 152 can store data, such as a program of instructions for operating the breaker trip detection. It should be noted that while a single memory is described, a wide variety of types and combinations of memory (e.g., tangible, non-transitory memory) can be employed. The memory 152 can be integral with the processor 150, can comprise stand-alone memory, or can be a combination of both. Some examples of the memory 152 can include removable and non-removable memory components, such as a programmable logic device, random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 154 of the monitoring subsystem 140 may be operatively configured to communicate with other components of the power distribution system 100, including a line side voltage measurement or current measurement through the at least one circuit breaker. It is contemplated that the power distribution system 100 may include one or more current transformers associated with the at least one circuit breaker whereby a current measurement through the at least one circuit breaker may be communicated to communication interface 154 of the monitoring subsystem 140. While current transformers may be employed, other types of current measurement may also be employed by the power distribution system 100. For example, a current measurement may be obtained through a Rogowski Coil, a Hall Effect device, or a shunt device. The power distribution system 100 may include a voltage detector or sensor to determine the line side or load side voltage of the at least one circuit breaker 120A, 120B, wherein the voltage may be resistor attenuated to levels which are measurable. It is contemplated that the communication interface 154 may be configured to retrieve data, transmit data for storage in the memory 152, retrieve data from the memory 152, and so forth. The communication interface 154 may also be communicatively coupled with the processor 150 to facilitate data transfer between system components of the power distribution system 100.

Figure 4C:
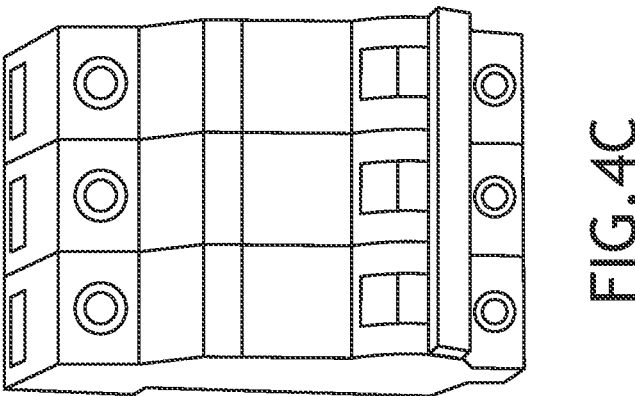
FIGS. 4A, 4B, and 4C depict an exemplary 1 pole circuit breaker, 2 pole circuit breaker, and 3 pole circuit breaker, respectively, in accordance with one or more embodiments of the present disclosure.
Figure 4B:
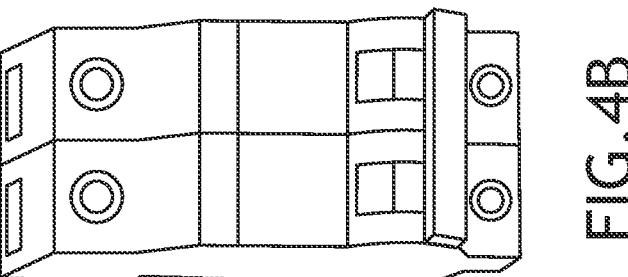
Figure 4A:
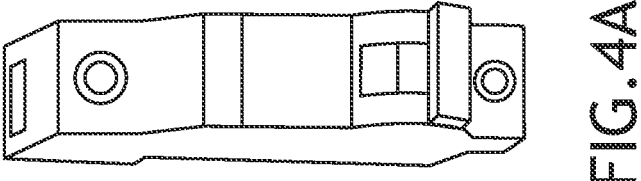

Referring to FIGS. 4A, 4B, and 4C, an exemplary 1 pole circuit breaker, 2 pole circuit breaker, and 3 pole circuit breaker are shown, respectively, in accordance with one or more embodiments of the present disclosure. It is contemplated that any type of circuit breaker may be operable with the power distribution system 100 of the present disclosure whereby the power distribution system 100 is configured to detect a breaker trip without the requirement of a circuit breaker auxiliary switch (Aux or Bell). Advantageously, the detection of breaker trip may be implemented without the added costs for the hardware elements of the circuit breaker auxiliary switch and does not require additional wires and connections required for a circuit breaker auxiliary switch.

Figure 5:
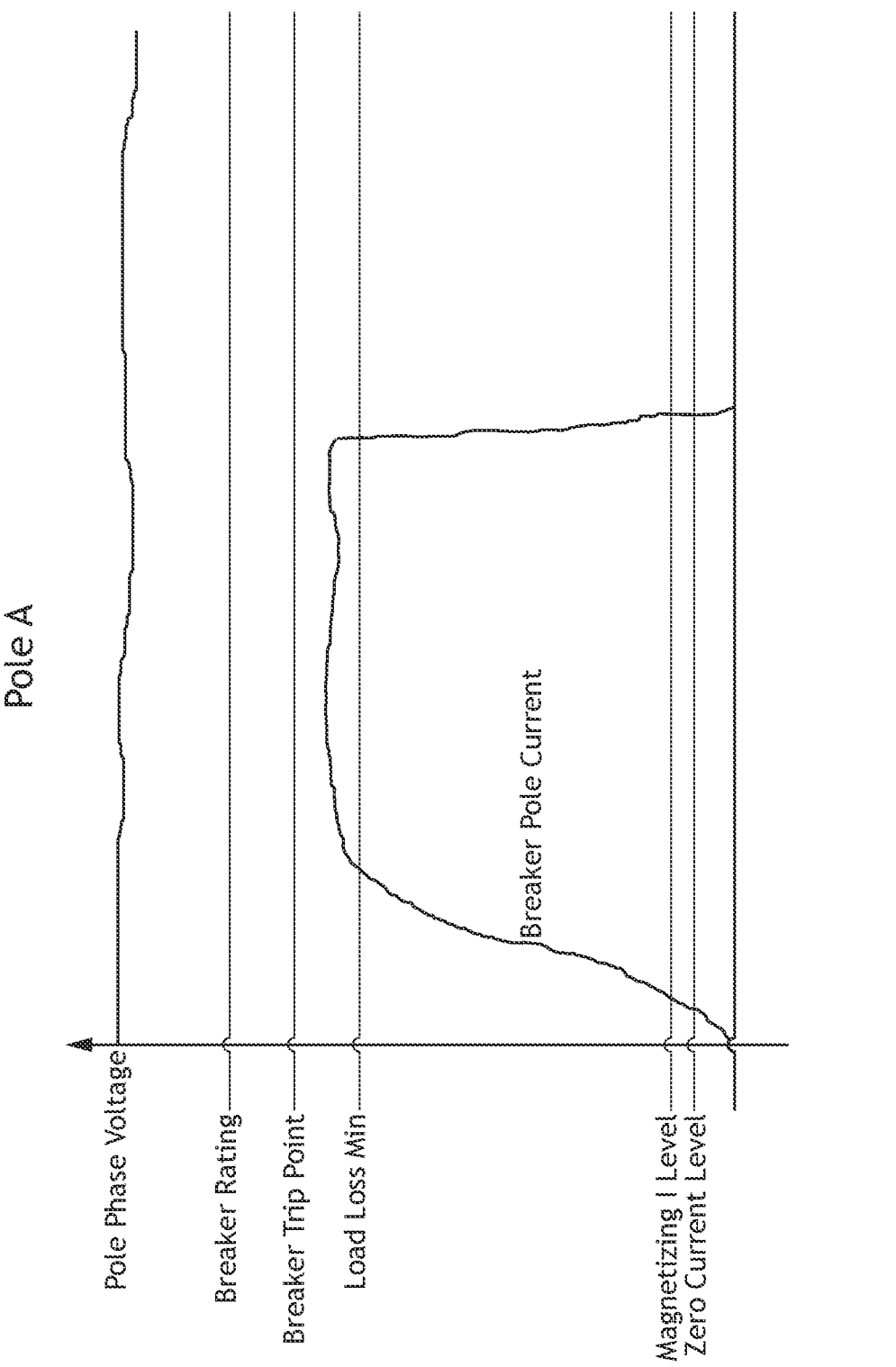
FIG. 5 depicts exemplary power characteristics when a breaker trip condition is detected when the current through the at least one circuit breaker falls below the minimum value and then below a zero current level or a circuit breaker magnetizing current level within a threshold number of line cycles and the line side voltage of the at least one circuit breaker remains above the undervoltage fault value, in accordance with one or more embodiments of the present disclosure.

Referring to FIG. 5, exemplary power characteristics are shown when a breaker trip condition is detected as the current through the at least one circuit breaker falls below the minimum value and then below a zero current level or a circuit breaker magnetizing current level within a threshold number of line cycles, and the line side voltage of the at least one circuit breaker remains above the undervoltage fault value, in accordance with one or more embodiments of the present disclosure. It is contemplated that the monitoring subsystem 140 of FIG. 1 may be configured to execute a method 200 embodied in a program of instructions which may be executed by the processor to determine when a breaker trip has occurred, and provide a notification of the breaker trip. Advantageously, the monitoring subsystem 140 may be able to detect a breaker trip while distinguishing from a condition which is indicative of a power loss due to a utility loss or an upstream circuit breaker being opened.

It is contemplated that the method may begin upon a detection of one or more conditions. The first condition may be detection of the line side voltage associated with the circuit breaker shall be above the undervoltage fault value. The line side voltage may be a root-mean-squared ("RMS") voltage according to one embodiment of the present disclosure. It is contemplated that the system may operate on full cycle RMS voltages and current, but it could manifest as subcycle measurements as in half cycle measurements.

It is contemplated that the undervoltage fault value may be a voltage value that is based upon a percentage of rated phase or line voltage of a configured power service configuration, e.g., wye or delta, and intended region of use, e.g., NAM vs. EMEA. The undervoltage fault value may also be determined during operation, (e.g. learned over time) by monitoring a working voltage at run-time and then establishing a percentage of the working voltage as an undervoltage fault value. The percentage of undervoltage fault value may be 20%-80% to allow for margin since voltage specification may allow for −10% lower limit as required by UL. A percentage of undervoltage fault value on a higher side of range may be preferred if downstream logic is powered from the load side of circuit breaker and may need to inter-operate with this logic and alarming function long enough before it loses power when the hold time of its switch-mode power supply depletes.

Alternatively, the first condition may be detection of an upstream mains current is above the higher current level of a zero current level or a magnetizing current level for the mains circuit breaker when the current through the circuit breaker of reference (such as a branch breaker) is exceeding a minimum value (also referred in the FIG. 5 as the Load Loss Min Load Setting). If the voltage sensing for the circuit breaker (such as a branch breaker as shown in FIG. 3) is on a line side of the mains circuit breaker, then the mains current may be used to prequalify the detection. Using voltage at the line side of the main circuit breaker as prequalification for the at least one circuit breaker of reference would not prevent unwanted detection of a breaker trip when the main breaker is opened or tripped, thus mains current is used in this case.

When the mains current drops to zero, the measured current will drop but may have some residual current present from current transformer magnetization, referred as circuit breaker magnetizing current. The value of the magnetization current for the main circuit breaker may be captured when the circuit breaker of reference has a current that is exceeding the minimum value. The mains magnetizing current value is a function of the size of the current transformer and may refer to a value that is typically 4% of the mains current supplied to all the branch breaker circuits in the panel board as shown in FIG. 3. The mains circuit breaker magnetizing current value being selected as 4% of the mains current supplied to all the branch circuits in the panel board as shown in FIG. 3 is beneficial as it provided better results of an actual breaker trip. It is contemplated that this condition may further prevent a false detection of a breaker trip in the case a power loss or upstream breaker opening.

It is contemplated that the zero current level may refer to a low current measurement at which the hardware and monitoring subsystem is not capable of making accurate measurements. Typically, this would be on the order of 0.1% of the of the breaker measurement capability. For example, if the current transformer and related hardware may measure 100 Amps (maximum), then the zero current level would be 0.1 Amps.

It is contemplated that the circuit breaker magnetizing current level (a branch circuit breaker) of the at least one circuit breaker may be 1% the circuit breaker relative current captured when the circuit breaker current is above the Load Loss Min Load Setting or minimum value for at least one cycle. When the current drops to zero current level, the measured current will drop but may have some residual current present from current transformer magnetization. This magnetization current may be higher than the zero current level. It is contemplated that this condition, including measurement of zero current level and circuit breaker magnetizing current level, may further prevent a false detection of a breaker trip in the case a power loss or upstream breaker opening.

Another condition may be detection of the current through the circuit breaker exceeds the minimum value (the Load Loss Min Load setting which is typically 80% of the breaker rating) for at least one line cycle. For example, if the circuit breaker has a capacity of 20 Amps, the load loss min load setting or the minimum value would be 80% of 20 Amps, which would be 16 Amps in this example. The breaker rating may be equivalent to the rated trip point of the circuit breaker. It is contemplated that the current measurement may be an unfiltered RMS current value.

The monitoring subsystem may notify of a breaker trip condition when the current through the at least one circuit breaker falls below the minimum value, and then below a zero current level or a circuit breaker magnetizing current level within a threshold number of line cycles and the voltage of the at least one circuit breaker remains above the undervoltage fault value. It is contemplated that the threshold number of cycles has been tested and analyzed to compare the results against actual breaker trips. It has been determined that the threshold number of cycles may be 7-14 line cycles, preferably 8-13 line cycles, and most preferred 9-12 line cycles. This allows for some margin against blips in the measured current against a false detection of breaker trip, while also being able to notify of an actual breaker trip as quickly as possible.

It is contemplated that using a threshold number of multiple, consecutive line cycles of line side voltage being greater that the undervoltage fault value may allow a robustness to prevent false positive detection, it is possible that a lower threshold number of cycles may be sufficient to detect a breaker trip, and may be less than one cycle. In the case of sub-cycle analysis, an unfiltered RMS voltage may be a measurement choice for a half cycle, but also sudden discontinuity, e.g., reduction in peak instantaneous current measurement could be used, if a quarter line cycle detection rate may be employed. In such a fashion, the threshold number of cycles may be a ¼ to 1 line cycle duration, and thus may be a threshold number of line cycle quadrants. For example, the threshold number of line cycles refers to a number of line cycle quadrants, the line cycle quadrants being representative of ¼ a line cycle, and the number of line cycle quadrants being 1 to 4. It is further contemplated that the threshold number of line cycles, or threshold number of line cycle quadrants may be adaptable, and not fixed, based upon current operating conditions or changes in operating conditions.

Figure 6:
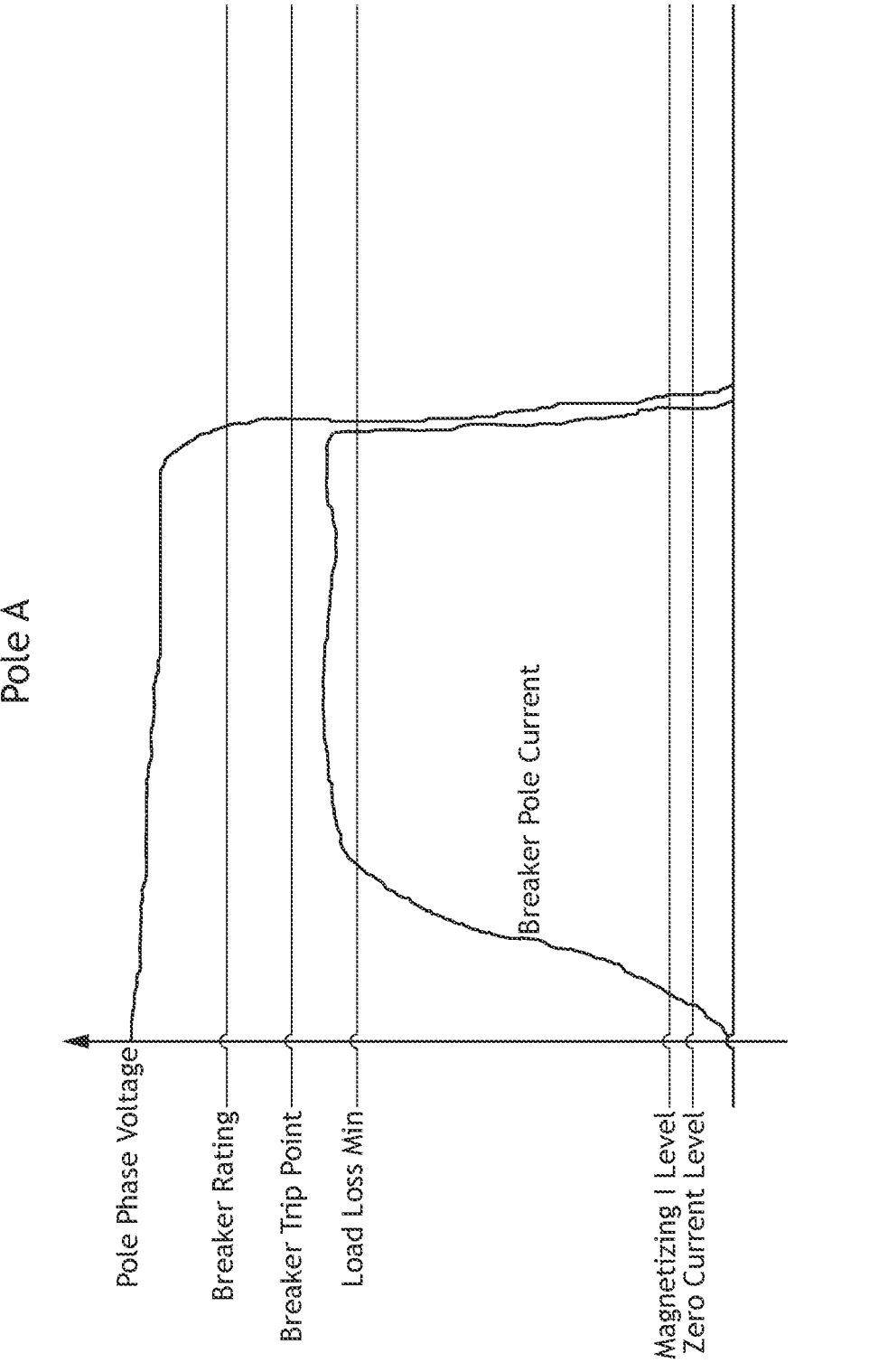
FIG. 6 depicts exemplary power characteristics when a loss power event or trip of an upstream breaker is detected when the current through the at least one circuit breaker falls below the minimum value and then below a zero current level or a circuit breaker magnetizing current level within a threshold number of line cycles, and the line side voltage of the at least one circuit breaker is below the undervoltage fault value, in accordance with one or more embodiments of the present disclosure.

Referring to FIG. 6, exemplary power characteristics are shown when a loss power event or trip of an upstream breaker is detected when the current through the at least one circuit breaker falls below the minimum value and then below a zero current level or a circuit breaker magnetizing current level within a threshold number of line cycles, and the line side voltage of the at least one circuit breaker is below the undervoltage fault value, in accordance with one or more embodiments of the present disclosure. If the current through the circuit breaker falls below the minimum value (Load Loss Min setting) and then drops below the zero current limit or below a magnetizing current level for the circuit breaker (typically 1% of this relative circuit breaker current) within a threshold number of cycles, but the voltage (or mains current) also drops, then a breaker trip is not detected and no notification alert will be presented. Rather, in this situation, the measured data indicates a power loss due to utility loss or an upstream breaker being opened.

While the method and FIGS. 5-6 depict a single pole circuit breaker, it is contemplated that the method would be applicable for multiple pole circuit breakers whereby each pole would be individually measured and where all the poles indicate current below the zero current level or below a magnetizing current level for the circuit breaker.

It is contemplated that after a breaker trip, it may be required to reset the method in order to continue monitoring after the circuit breaker has been reset. In an embodiment, the monitoring subsystem may reset the method when the current through the circuit breaker is greater than the zero current level and greater than the magnetizing current level for a threshold number of cycles. Alternatively, the method may be reset when a user presses the reset fault button.

Below, it is contemplated that the program of instructions may presented in the following manner according to one embodiment of the present disclosure for monitoring of branch breakers of the Panel Board as shown in an exemplary manner in FIG. 3.

There shall be a Load Loss Detected Enabled admin setting that may be a switch located in the Branch Breaker Configuration to enable this operation and detect this event. Default is YES, otherwise NO. It is contemplated that the detection of a breaker open condition, or breaker trip, is a load loss event.

There shall be a "Load Loss Min Load" admin setting that may be a slider located on the Circuit Breaker Configuration tab after the Load Loss Detected Enabled setting. This may be only visible when Load Loss Detected Enabled is YES. Default is the same as the Overcurrent Fault setting for the associated branch breaker when visible as a percentage of breaker rating. Min is 20%, max is 100%. Unit description with "of rated" text.

There may be a service setting, "Voltage Sense Location" with 2 options "Load Side" or "Line Side" (of the main input breaker) and defaulting to "Load Side".

There may be a "Load Loss Detected" event, with the severity of Fault, and displayed in the active events and event log with parametric data of Panelboard Name (Component), Breaker Number (Sub Component), and highest phase/pole IRMS.

Event Detection shall be armed when the following conditions are met:
1. The Event Detection is disarmed
2. Load Loss Detected Enabled setting is YES.
3. The branch breaker unfiltered RMS current for any one pole exceeds the Load Loss Min Load setting for at least one line cycle Event detection shall be disarmed when the following conditions are TRUE:
1. The Event Detection is armed
2. The branch breaker unfiltered RMS current of all poles falls below Load Loss Min Load setting for threshold number of consecutive cycles but not below the zero current level or not below the branch breaker magnetizing current.
3. Load Loss Detected Enabled setting is NO.

Event is active when the following conditions are TRUE:
1. Event Detection is armed.
2. When either the following are true:
   1. When "Voltage Sense Location" setting is set to Load Side of main input breaker, the unfiltered RMS Phase voltage(L-N) associated with the branch breaker pole shall be above the Undervoltage Fault setting.
   2. When "Voltage Sense Location" setting is set to Line Side of main input breaker, the unfiltered mains RMS current on any phase is above the Zero Current Level or above the mains circuit breaker magnetizing current 4% of the prior RMS mains current for one line cycle.
3. The branch breaker Unfiltered RMS current for all poles are less than the Zero Current Level or 1% of the prior RMS current (branch breaker magnetizing current) for one line cycle, whichever is greater.
   1. Prior RMS current is defined as the last full cycle branch breaker unfiltered RMS current that was above the Load Loss Min Load setting (Maximum pole current per breaker).
4. Event is cleared when the following conditions are TRUE:
   1. The Breaker Unfiltered RMS current for any pole is greater than the Zero Current Level of breaker rating for 10 consecutive line cycles OR when user presses the reset fault button, detection is cleared.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be implemented, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those having skill in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A power distribution system, comprising:

an input power source;

at least one branch circuit breaker associated with each branch circuit, wherein the at least one branch circuit breaker receives power from the input power source; and a monitoring subsystem in communication with the at least one branch circuit breaker, the monitoring subsystem including:

a processor operatively coupled to the at least one branch circuit breaker; and a memory with instruction stored upon, that when executed by the processor, cause the processor to:

detect when a line side voltage of the at least one branch circuit breaker is above an undervoltage fault value and when a current through the at least one branch circuit breaker is above a minimum value for at least one line cycle;

receive a mains magnetizing current value of a mains circuit breaker;

receive a branch circuit breaker magnetizing current value;

determine, based on an analysis of both the mains magnetizing current value and the branch circuit breaker magnetizing current value, an indication of a branch breaker trip condition;

notify of a breaker trip condition when the current through the at least one branch circuit breaker falls below the minimum value and then below (1) a zero current level or (2) a prior circuit breaker magnetizing current level within a threshold number of line cycles and the line side voltage of the at least one circuit breaker remains above the undervoltage fault value, and the analysis of the both the mains magnetizing current value and the branch circuit breaker magnetizing current value indicates a branch breaker trip condition; and clear a detection of the breaker trip condition when the current through the branch circuit breaker is greater than (1) the zero current level or (2) greater than the prior circuit breaker magnetizing current level for a threshold number of line cycles.

2. The power distribution system of claim 1, wherein the threshold number of line cycles is between 7 and 14 line cycles.

3. The power distribution system of claim 1, wherein the threshold number of line cycles is between 8 and 13 line cycles.

4. The power distribution system of claim 1, wherein the threshold number of line cycles refers to a number of line cycle quadrants, line cycle quadrants being representative of ¼ a line cycle, the number of line cycle quadrants being 1 to 4.

5. The power distribution system of claim 1, wherein the processor is operatively coupled to the at least one branch circuit breaker; a memory with instruction stored upon, that when executed by the processor, causes the processor to further execute:

notify of a loss power event or trip of an upstream breaker when the current through the at least one branch circuit breaker falls below the minimum value and then below a zero current level or a branch circuit breaker magnetizing current level within a threshold number of line cycles and the line side voltage of the at least one branch circuit breaker is below the undervoltage fault value.

6. The power distribution system of claim 1, wherein the at least one branch circuit breaker is located within a panel board.

7. The power distribution system of claim 1, wherein the input source of power is a 3 phase Alternating Current power source.

8. The power distribution system of claim 1, wherein the monitoring subsystem further comprises a communication interface which receives voltage information and current information related to the at least one branch circuit breaker.

9. The power distribution system of claim 1, wherein the minimum value is a current value that is 80% of a breaker current rating of the at least one branch circuit breaker.

10. The power distribution system of claim 1, wherein the processor notifies of the breaker trip condition when the current through the at least one branch circuit breaker falls below 1% of the prior circuit breaker magnetizing current level.

11. A method for notifying of a breaker trip in a power distribution system, comprising:

operatively coupling an input power source and at least one circuit breaker associated with each branch circuit;

operatively coupling a monitoring subsystem to the at least one circuit breaker, the monitoring subsystem including a processor and a memory with instruction stored upon, that when executed by the processor, causes the one processor to:

detect when a line side voltage of the at least one branch circuit breaker is above an undervoltage fault value and when a current through the at least one circuit breaker is above a minimum value for at least one line cycle;

receive a mains magnetizing current value of a mains circuit breaker;

receive a branch circuit breaker magnetizing current value;

determine, based on an analysis of both the mains magnetizing current value and the branch circuit breaker magnetizing current value, an indication of a branch breaker trip condition;

notify the branch breaker trip condition when the current through the at least one branch circuit breaker falls below the minimum value and then below (1) a zero current level or (2) a circuit breaker magnetizing current level within a threshold number of line cycles and the line side voltage of the at least one circuit breaker remains above the undervoltage fault value, and the analysis of the both the mains magnetizing current value and the branch circuit breaker magnetizing current value indicates a branch breaker trip condition; and clear a detection of a breaker trip condition when the current through the branch circuit breaker is (1) greater than zero current level or (2) greater than a prior circuit breaker magnetizing current level for a threshold number of line cycles.

12. The method of claim 11, wherein the threshold number of line cycles is between 7 and 14 line cycles.

13. The method of claim 11, wherein the threshold number of line cycles is between 8 and 13 line cycles.

14. The method of claim 11, wherein the threshold number of line cycles refers to a number of line cycle quadrants, the line cycle quadrants being representative of ¼ a line cycle, the number of line cycle quadrants being 1 to 4.

15. The method of claim 11, wherein the processor is operatively coupled to the at least one branch circuit breaker, wherein the instruction causes the processor to further:

notify of a loss power event or trip of an upstream breaker when the current through the at least one branch circuit breaker falls below the minimum value and then below a zero current level or a circuit breaker magnetizing current level within a threshold number of line cycles and the line side voltage of the at least one branch circuit breaker is below the undervoltage fault value.

16. The method of claim 11, wherein the line side voltage is a RMS voltage.

17. The power distribution system of claim 11, wherein the minimum value is a current value that is 80% of a breaker current rating of the at least one branch circuit breaker.

18. The method of claim 11, wherein the processor notifies of a branch breaker trip condition when the current through at least one branch circuit breaker falls below 1% of the prior branch circuit breaker magnetizing current level.

* * * * *